(12) United States Patent
Chen et al.

(10) Patent No.: US 11,069,792 B2
(45) Date of Patent: Jul. 20, 2021

(54) SEMICONDUCTOR DEVICE AND MANUFACTURING METHOD THEREFOR

(71) Applicants: Semiconductor Manufacturing International (Shanghai) Corporation, Shanghai (CN); Semiconductor Manufacturing International (Beijing) Corporation, Shanghai (CN)

(72) Inventors: Zhuofan Chen, Shanghai (CN); Haiyang Zhang, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/701,994

(22) Filed: Dec. 3, 2019

(65) Prior Publication Data
US 2020/0105907 A1    Apr. 2, 2020

Related U.S. Application Data

(62) Division of application No. 15/823,029, filed on Nov. 27, 2017, now Pat. No. 10,522,651.

(30) Foreign Application Priority Data

Dec. 1, 2016 (CN) .......................... 201611085085.3

(51) Int. Cl.
*H01L 27/108* (2006.01)
*H01L 29/66* (2006.01)
(Continued)

(52) U.S. Cl.
CPC .. *H01L 29/66545* (2013.01); *H01L 21/76224* (2013.01); *H01L 21/823821* (2013.01);
(Continued)

(58) Field of Classification Search
CPC ....... H01L 21/76224; H01L 21/823821; H01L 21/823878; H01L 29/66545; H01L 29/0649
(Continued)

(56) References Cited

U.S. PATENT DOCUMENTS 4,650,544 A * 3/1987 Erb ..................... H01L 21/3086
                                                          257/510
5,793,077 A * 8/1998 Tseng ................ H01L 27/10861
                                                          257/301
(Continued)

*Primary Examiner* — Tan N Tran
(74) *Attorney, Agent, or Firm* — Brinks Gilson & Lione

(57) ABSTRACT

The present disclosure relates to the technical field of semiconductors, and discloses a semiconductor device and a manufacturing method therefor. The manufacturing method may include: providing a semiconductor structure, where the semiconductor structure includes a semiconductor fin and an interlayer dielectric layer covering the semiconductor fin, the interlayer dielectric layer having an opening exposing a part of the semiconductor fin; forming a data storage layer at a bottom portion and a side surface of the opening; and filling a conductive material layer in the opening on the data storage layer. The present disclosure facilitate the manufacturing process of the semiconductor device and improves processing compatibility with the CMOS technology.

6 Claims, 7 Drawing Sheets

(51) Int. Cl.
*H01L 45/00* (2006.01)
*H01L 27/24* (2006.01)
*H01L 21/762* (2006.01)
*H01L 21/8238* (2006.01)
*H01L 29/06* (2006.01)
*H01L 29/423* (2006.01)
*H01L 29/78* (2006.01)

(52) U.S. Cl.
CPC .......... *H01L 21/823828* (2013.01); *H01L 21/823878* (2013.01); *H01L 27/2436* (2013.01); *H01L 29/0649* (2013.01); *H01L 29/42364* (2013.01); *H01L 29/66795* (2013.01); *H01L 29/7856* (2013.01); *H01L 45/124* (2013.01); *H01L 45/146* (2013.01); *H01L 45/16* (2013.01)

(58) Field of Classification Search
USPC .................................. 257/296, 298, 300, 369
See application file for complete search history.

(56) References Cited

U.S. PATENT DOCUMENTS

| | | | |
|---|---|---|---|
| 6,710,391 B2* | 3/2004 | Houston | H01L 27/10811 257/295 |
| 7,473,611 B2* | 1/2009 | Cho | H01L 27/115 438/381 |
| 7,759,724 B2 | 7/2010 | Forbes | |
| 8,232,588 B2* | 7/2012 | Doyle | H01L 27/10852 257/308 |
| 8,258,564 B2 | 9/2012 | Willer | |
| 2008/0237675 A1* | 10/2008 | Doyle | H01L 27/10852 257/303 |
| 2009/0140397 A1* | 6/2009 | Sukekawa | H01L 21/76834 257/637 |
| 2009/0325373 A1* | 12/2009 | Sugizaki | G11C 16/0466 438/591 |
| 2016/0379976 A1* | 12/2016 | Kim | H01L 21/823481 257/401 |

* cited by examiner

SEMICONDUCTOR DEVICE AND MANUFACTURING METHOD THEREFOR

CROSS REFERENCE TO RELATED APPLICATIONS

This application is a divisional of U.S. application Ser. No. 15/823,029, filed on Nov. 27, 2017 (still pending), which claims priority to Chinese Patent Application CN201611085085.3, filed Dec. 1, 2016, the entirety of each are incorporated by reference.

BACKGROUND

Technical Field

The present disclosure relates to the technical field of semiconductors, particularly to a semiconductor device and a manufacturing method therefor, and more particularly to a resistive memory and a manufacturing method therefor.

Related Art

At present, RRAM (Resistive Random Access Memory) has generated much interest because this type of memory possesses several properties, such as structure simplicity, low power consumption, high operation speed, and high level of integration density. In some instances, a RRAM needs to be formed adjacent to a FinFET (Fin Field Effect Transistor).

FIG. 1 is a cross-sectional diagram that schematically illustrates a FinFET in the prior art and a structure of a RRAM formed adjacent to the FinFET. FIG. 1 shows a FinFET device portion and a RRAM device portion. As shown in FIG. 1, the FinFET device may include: a semiconductor substrate 101, an upper semiconductor fin 102 on the semiconductor substrate 101, a gate insulator layer 104 on the semiconductor fin 102, a gate electrode 105 on the gate insulator layer 104, a spacer 106 at a side surface of the gate electrode 105, a source electrode 112 and a drain electrode 111 respectively at two sides of the gate electrode 105, a source contact 113 connected to the source electrode 112, and a drain contact 114 connected to the drain electrode 111. The RRAM device may be composed of a dummy gate 121, a data storage layer 122, and a fin portion, as shown in the dotted box in FIG. 1. In addition, FIG. 1 also shows an STI (Shallow Trench Isolation) 103 and an interlayer dielectric layer 108. As shown in FIG. 1, the data storage layer 122 is merely formed at a small portion between the semiconductor fin and the dummy gate 121. In this way, the feature to be processed is small, leading to requirement for more precise processing control and increased manufacturing difficulties.

The drain contact 114 on the drain electrode spans the FinFET device portion and the RRAM device portion. Therefore, the contact 114 may also be referred to as a slot contact. The RRAM in FIG. 1 may be correspondingly referred to as a SCRRAM (standing for Slot Contact RRAM). Existing investigations show that when a length Sx of an alignment portion (or overlapping portion) of the slot contact 114 and the dummy gate 121 is between 10 nm to 14 nm (i.e., an error of the length of the alignment portion is only 4 nm), better initial read current may be obtained and a better voltage may be formed. This precision of alignment calls for demanding processing control of only several nanometers. In the meanwhile, self-aligning contact process is difficult to implement. In addition, a long vertical portion of the slot contact 114, and a F-shaped upper portion of the slot contact 114 all lead to difficulties in the manufacturing of the slot contact.

SUMMARY

The inventor of this disclosure finds that the foregoing prior art has problems, and provides a new technical solution to at least one of the problems.

According to a first aspect of the present disclosure, a method for manufacturing a semiconductor device is provided, including: providing a semiconductor structure, where the semiconductor structure includes: a semiconductor fin and an interlayer dielectric layer covering the semiconductor fin, the interlayer dielectric layer having an opening exposing a first part of the semiconductor fin; forming a data storage layer at a bottom portion and a side surface of the opening; and filling a conductive material layer in the opening on the data storage layer.

In a form, step of the providing a semiconductor structure includes: providing an initial structure, where the initial structure includes: a semiconductor fin, an interlayer dielectric layer covering the semiconductor fin, and a first dummy gate located in the interlayer dielectric layer, wherein an upper surface of the first dummy gate flushing with an upper surface of the interlayer dielectric layer; and removing the first dummy gate, so as to form the opening exposing the first part of the semiconductor fin.

In a form, the first dummy gate is separated from the semiconductor fin; and removing the first dummy gate includes: removing the first dummy gate to form an opening; and enlarging the opening by using a first etching process, so as to expose the first part of the semiconductor fin.

In a form, the initial structure further includes: a trench isolation portion abutting against a side surface of the semiconductor fin and the first dummy gate is located above the trench isolation portion.

In a form, a side surface of the semiconductor fin is an inclined surface, and the first part of the semiconductor fin exposed by the opening is within the inclined surface.

In a form, the data storage layer includes a transition metal oxide (TMO), for example, HfO2.

In a form, the method further includes: forming a conductive contact on the conductive material layer.

In a form, the method further includes: forming, in the interlayer dielectric layer, a gate structure located on the semiconductor fin.

In a form, a method for forming the gate structure includes: forming, in the interlayer dielectric layer, a second dummy gate located on the semiconductor fin, wherein an upper surface of the second dummy gate is flush with the upper surface of the interlayer dielectric layer; removing the second dummy gate, so as to form an open trench exposing a second part of the semiconductor fin; and forming a high-k metal-gate structure in the open trench.

In a form, before removing the first dummy gate to form the opening, the method further includes: forming a first patterned mask layer on the interlayer dielectric layer, the first mask layer covering the second dummy gate and exposing the first dummy gate; and wherein after removing the first dummy gate to form the opening and before forming the data storage layer, the method further includes: removing the first patterned mask layer.

In a form, wherein forming the gate structure includes: removing the second dummy gate, so as to form an open trench exposing a part of the semiconductor fin; and forming a gate structure in the open trench.

In a form, step of the removing the second dummy gate includes: forming a second patterned mask layer on the interlayer dielectric layer covering the data storage layer and the conductive material layer and exposing the second dummy gate; removing the second dummy gate using a second etching process, so as to form the open trench exposing the second part of the semiconductor fin; and removing the second patterned mask layer.

In the manufacturing method of the present disclosure, a process window has a larger size and is easy to be manufactured and implemented. Moreover, the manufacturing method of the present disclosure has good compatibility with the CMOS process.

According to a second aspect of the present disclosure, a semiconductor device is provided, including: a semiconductor fin; an interlayer dielectric layer covering the semiconductor fin, where the interlayer dielectric layer has an opening exposing a first part of the semiconductor fin; a data storage layer in the opening of the interlayer dielectric layer; and a conductive material layer filing the opening and surrounded by the data storage layer.

In a form, the semiconductor device further includes: a trench isolation portion abutting against a side surface of the semiconductor fin, where the data storage layer is located above the trench isolation portion.

In a form, the data storage layer is in contact with one side of the semiconductor fin.

In a form, a side surface of the semiconductor fin is an inclined surface, the first part of the semiconductor fin exposed by the opening is within the inclined surface.

In a form, the data storage layer here is known as TMO.

In a form, the semiconductor device further includes: a conductive contact on the conductive material layer.

In a form, the semiconductor device further includes: a gate structure in the interlayer dielectric layer and located on and wrapped-around the semiconductor fin.

The semiconductor device according to the forms of the present disclosure has advantages such as large process window size and being easy to be manufactured, and has good compatibility with the CMOS process.

According to the following detailed descriptions of the forms for illustration purposes of the present disclosure with reference to the accompanying drawings, other characters and advantages of the present disclosure become clear.

BRIEF DESCRIPTION OF THE DRAWINGS

The accompanying drawings that form a part of the specification describe the forms of the present disclosure, and are used to explain the principles of the present disclosure together with the specification.

With reference to the accompanying drawings, the present disclosure can be understood more clearly according to the following detailed description, where.

DETAILED DESCRIPTION

Embodiments for illustration purposes of the present are described in details with reference to the accompanying drawings. It should be noted that unless being described in detail, relative layouts, mathematical expressions, and numeric values of components and steps described in these forms do not limit the scope of the present disclosure.

Meanwhile, it should be noted that for ease of description, sizes of the parts shown in the accompanying drawings are not drawn according to an actual proportional relationship.

The following exemplary forms are presented for illustration purposes only, and should not be used as any limitation on the present disclosure and applications or uses of the present disclosure.

Technologies, methods, and devices that are known by a person of ordinary skill in the relate fields may not be discussed in detail. However, if appropriate, the technologies, methods, and devices should be considered as a part of the description.

In all examples shown and discussed herein, any specific value should be regarded as being an example rather than a limitation. Therefore, other examples of the forms for illustration purposes may have different values.

It should be noted that: similar reference signs, labels, numerals, and letters represent similar items in the following accompanying drawings. Therefore, once an item is defined in a figure, the item needs not to be further re-defined in subsequent figures.

Figure 2:
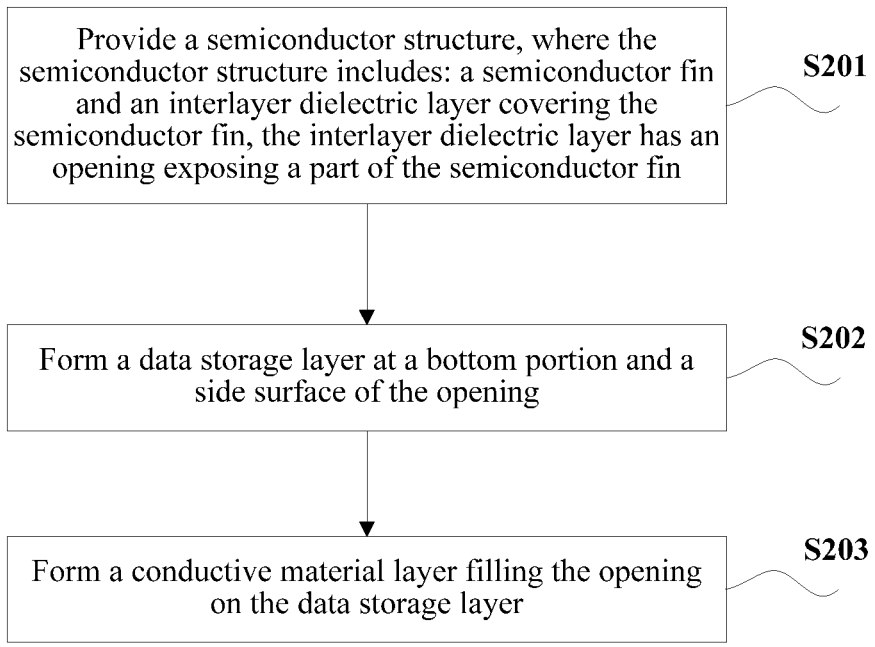
FIG. 2 is a flowchart of a method for manufacturing a semiconductor device.

FIG. 2 is a flowchart of an exemplary process for manufacturing a semiconductor device. FIG. 3A to FIG. 3F are cross-sectional views that schematically illustrate the semiconductor device at a plurality of phases of a manufacturing process of the semiconductor device. The exemplary manufacturing process of the semiconductor device is described in detail below with reference to FIG. 2 and FIG. 3A to FIG. 3F.

In step S201, a semiconductor structure is provided. The semiconductor structure includes: a semiconductor fin and an interlayer dielectric layer covering the semiconductor fin, where the interlayer dielectric layer has an opening exposing a part of the semiconductor fin.

Figure 3A:
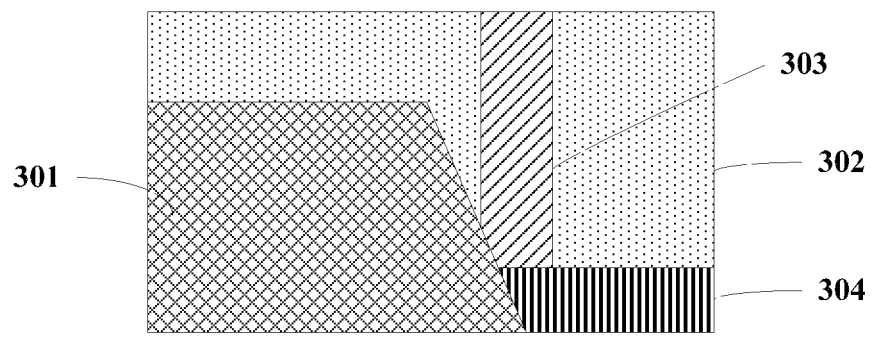
FIG. 3A to FIG. 3F are cross-sectional views that schematically illustrate a semiconductor device at a plurality of phases of a manufacturing process.

A process of providing the semiconductor structure is described in the following with reference to FIG. 3A and FIG. 3B. In one implementation, as shown in FIG. 3A, the step of providing the semiconductor structure may include: for example, as shown in FIG. 3A, providing an initial structure. The initial structure may include: a semiconductor fin 301, an interlayer dielectric layer 302 covering the semiconductor fin 301, and a first dummy gate 303 located in the interlayer dielectric layer 302. An upper surface of the first dummy gate 303 flushes with an upper surface of the interlayer dielectric layer 302.

It should be noted that the term "flush with" used in the present disclosure includes, but not limited to exact flushing. Instead, alignment error may be allowed. As such, the term "flush with" may include "approximately flush with" within the process control uncertainties.

It should be noted that to avoid obscuring the concepts of the present disclosure, FIG. 3A does not show details generally known in the art. For example, a source electrode, a drain electrode, or a gate insulator layer is not shown. However, according to the foregoing description, a person of ordinary skill in the art would understand how to implement the technical solution disclosed herein.

In one implementation, material of the semiconductor fin 301 may be silicon. The semiconductor fin 301, for example, may be doped silicon (such as phosphorus-doped silicon). Material of the interlayer dielectric layer 302 may be, for example, silicon dioxide. Material of the first dummy gate may be, for example, polysilicon.

In a form, as shown in FIG. 3A, a side surface of the semiconductor fin 301 may be an inclined surface. The first dummy gate is in contact with (as shown in FIG. 3A) or separated from (not shown in FIG. 3A) the inclined surface. It should be noted that the term "side surface" herein refers to a surface of various surfaces of the semiconductor fin that is in contact with a trench isolation portion (described below).

In a form, as shown in FIG. 3A, the initial structure may further include a trench isolation portion 304 which abuts against the inclined side surface of the semiconductor fin. The trench isolation portion 304 may include a trench adjacent to the semiconductor fin and a trench insulator layer which at least partly fills the trench (the trench insulator layer, for example, may comprise silicon dioxide). In one implementation, the first dummy gate 303 is located above the trench isolation portion.

It should be noted that although FIG. 3A shows that the first dummy gate is located above the trench isolation portion, a person of ordinary skill in the art should understand that the first dummy gate may be at other positions. For example, the first dummy gate may be above the semiconductor fin. Alternatively, part of the first dummy gate may be above the trench isolation portion, and the other part may be above the semiconductor fin. As such, the scope of the present disclosure is not limited hereto as to the location of the first dummy gate.

Figure 3B:
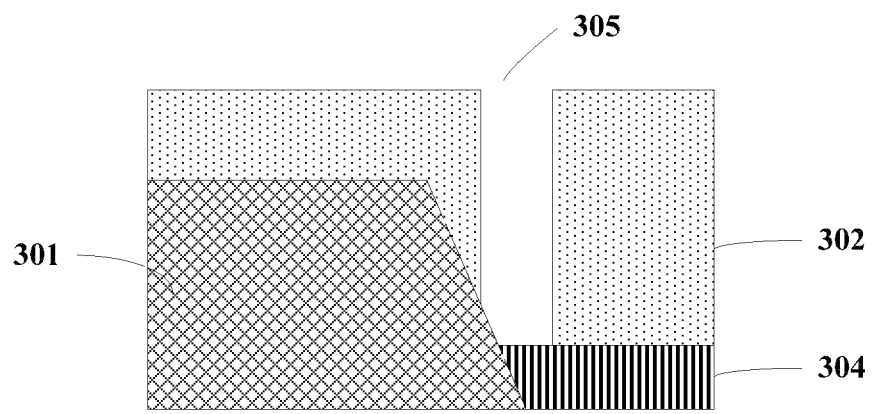

Optionally, as shown in FIG. 3B, the step of the providing a semiconductor structure may further include: removing the first dummy gate 303, so as to form an opening 305 exposing a part of the semiconductor fin. For example, as shown in FIG. 3B, in a case in which the first dummy gate 303 is in contact with the inclined surface of the semiconductor fin 301, the first dummy gate 303 is removed by using the etching process. In this way, the opening 305 exposing a part of the semiconductor fin may be directly formed.

It should be noted that although FIG. 3B, as an example, shows that the opening 305 exposes the inclined side surface of the semiconductor fin, a person of ordinary skill in the art should understand that a position of the opening is not limited hereto. For example, the opening may be entirely located above an upper surface of the semiconductor fin rather than the inclined side surface. For another example, a part of the opening may be located above the upper surface of the semiconductor fin, and the other part may expose the inclined side surface of the semiconductor fin.

In a further alternative form, the first dummy gate is separated from the semiconductor fin. That is, the first dummy gate is not in contact with the inclined side surface or the upper surface of the semiconductor fin. In such a case, the step of forming the opening may include: removing the first dummy gate, so as to form the opening (the opening does not expose a part of the semiconductor fin yet); and enlarging the opening by using an etching process (for example, an isotropic dry etching process), so as to expose a part of the semiconductor fin. The enlargement process herein may increase feature size of the opening and provide relaxed process control precision, thereby facilitating the implementation of a subsequent filling process for the opening.

Back to FIG. 2, in step 5202, a data storage layer at a bottom portion and a side surface of the opening is formed.

Figure 3C:
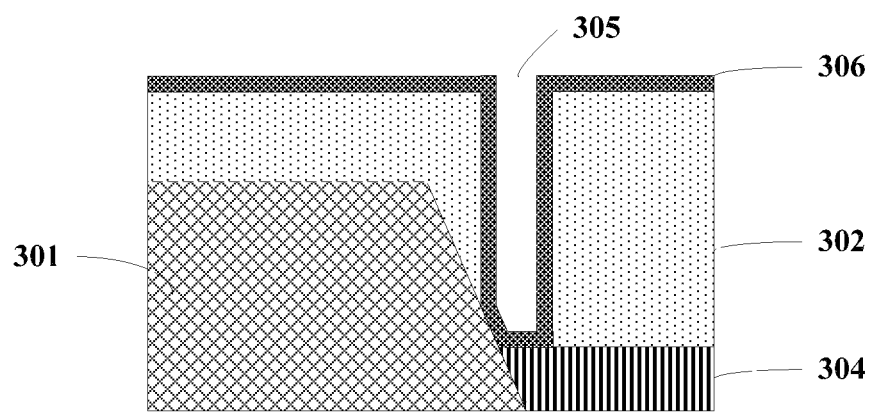

FIG. 3C schematically illustrates an exemplary cross-sectional view of the semiconductor device after step 5202. As shown in FIG. 3C, a data storage layer 306 is formed at the bottom portion and the side surface of the opening 305. The data storage layer 306 may be formed, for example, by using the deposition process. In a form, the data storage layer 306 may be a resistive functional layer used for a resistive memory. For example, material of the data storage layer may include a TMO (Transition Metal Oxide, transition metal oxide).

Back to FIG. 2, in step 5203, a conductive material layer is formed to fill the opening on the data storage layer.

Figure 3D:
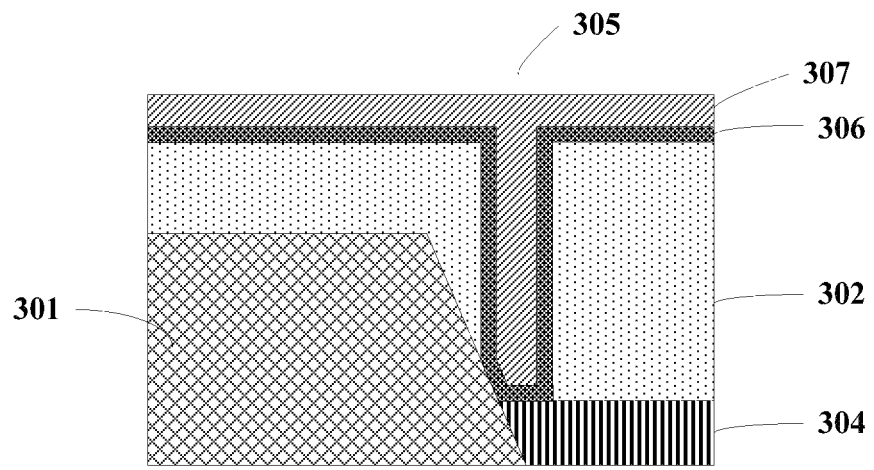

FIG. 3D schematically illustrates a cross-sectional view of the semiconductor device after step 5203. As shown in FIG. 3D, a conductive material layer 307 filling the opening 305 is formed on the data storage layer 306 by using, for example, a deposition process. The conductive material layer 307 may include various metals such as tungsten.

Figure 3E:
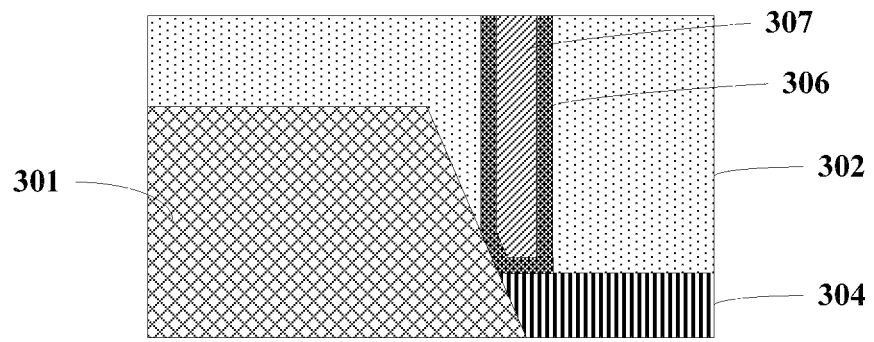

In a form, planarization, for example, CMP (Chemical Mechanical Planarization), may be performed on the structure shown in FIG. 3D, so as to remove the data storage layer 306 and a part of the conductive material layer 307 that is above the interlayer dielectric layer, thereby forming the structure shown in FIG. 3E.

A method for manufacturing a semiconductor device is provided above. The manufacturing method may be used to manufacture a resistive memory. Processing control precision may be relaxed, so that the manufacturing process of the semiconductor device becomes easier to implement. Further, the manufacturing method above does not rely on self-aligning contact process and thus avoid difficulties associated with such a process.

In addition, the manufacturing method above may be implemented in the Middle-End-Of-Line (MEOL) stage during a FinFET manufacturing process. Therefore, the manufacturing method above for RRAM with FinFET is compatible with CMOS processes.

Figure 1:
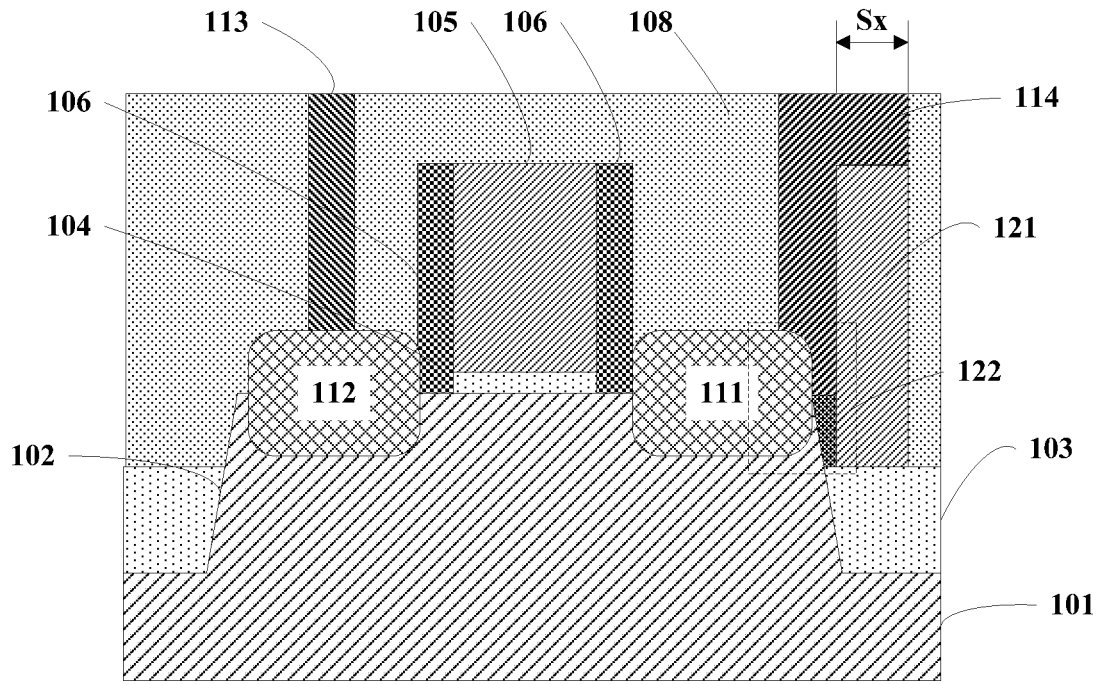
FIG. 1 is a cross-sectional view that schematically illustrates a FinFET and a RRAM formed adjacent to the FinFET in the prior art.
Figure 3F:
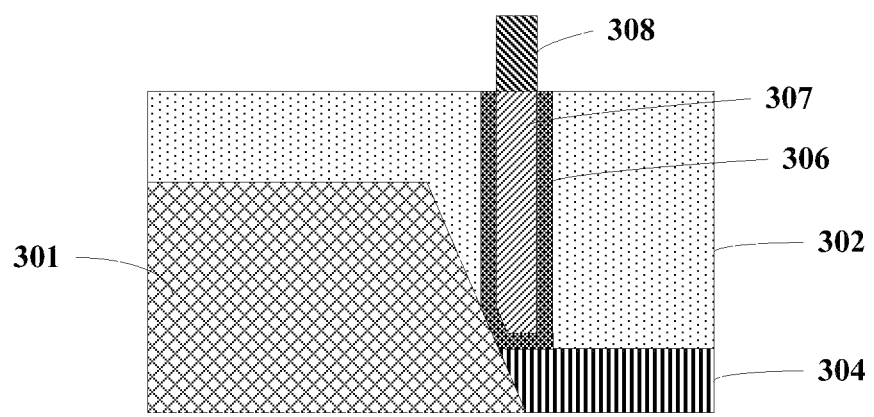

In a form, as shown in FIG. 3F, the method for manufacturing a semiconductor device above further includes: forming a conductive contact 308 on the conductive material layer 307. Material of the conductive contact may include, for example, metals such as tungsten. The conductive contact formed in this step is directly on the conductive material layer, and a F-shaped slot contact shown in FIG. 1 would be avoided. Moreover, the interlayer dielectric layer needs not to be deeply etched. Therefore, the manufacturing process of the semiconductor device becomes easier to be implemented.

In a form, the foregoing manufacturing process may further include: forming, in the interlayer dielectric layer, a gate structure located on the semiconductor fin. In one implementation, the method for forming the gate structure may include: forming, in the interlayer dielectric layer, a second dummy gate located on the semiconductor fin, where an upper surface of the second dummy gate flushes with an upper surface of the interlayer dielectric layer. In an exemplary implementation, the second dummy gate and the first dummy gate described above may be formed in the same process. The method for forming the gate structure may further include: removing the second dummy gate, so as to form an open trench exposing a part of the semiconductor fin. The method for forming the gate structure may further include: forming a gate structure in the open trench.

FIG. 4A to FIG. 4J are cross-sectional views that schematically illustrate a semiconductor device at a plurality of phases of another exemplary manufacturing process of the semiconductor device.

Figure 4A:
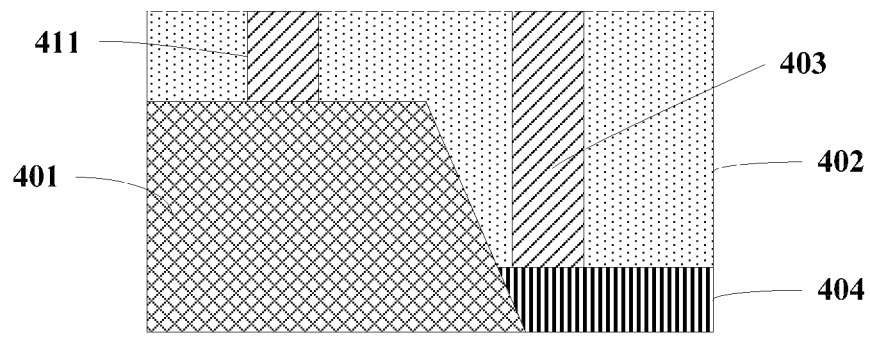
FIG. 4A to FIG. 4J are cross-sectional views that schematically illustrate another semiconductor device at a plurality of phases of another manufacturing process.

First, as shown in FIG. 4A, an initial structure is provided. The initial structure may include: a semiconductor fin 401, an interlayer dielectric layer 402 covering the semiconductor fin 401 and a first dummy gate 403 located in the interlayer dielectric layer 402. An upper surface of the first dummy gate 403 flushes with an upper surface of the interlayer dielectric layer 402. In a form, as shown in FIG. 4A, a side surface of the semiconductor fin 401 is an inclined surface, and the first dummy gate 403 is separated from the inclined surface. The initial structure may further include: a trench isolation portion 404 which abuts against the inclined side surface of the semiconductor fin 401.

In a form, as shown in FIG. 4A, the initial structure may further include: a second dummy gate 411 in the interlayer dielectric layer 402 and located on the semiconductor fin 401. An upper surface of the second dummy gate 411 flushes with the upper surface of the interlayer dielectric layer 402. For example, material of the second dummy gate 411 may include polysilicon. It should be noted that the structure shown in FIG. 4A is a cross-sectional diagram. Actually, in a form, the second dummy gate 411 may transversely wraps a part of the semiconductor fin 401. For example, the dummy gate 411 may wrap around side surfaces of the semiconductor fin substantially parallel to the cross-section.

In a form, the process of providing the initial structure shown in FIG. 4A may include: providing a first structure, where the first structure may include the semiconductor fin 401 and the trench isolation portion 404. In one implementation, the process may further include: forming the first dummy gate 403 on the trench isolation portion 404; and forming, on the semiconductor fin 401, the second dummy gate 411 wrapping a part of the semiconductor fin. In one implementation, the first dummy gate and the second dummy gate may be formed in the same process. The process of providing the initial structure may further include: depositing the interlayer dielectric layer 402 to cover the semiconductor fin 401, the trench isolation portion 404, the first dummy gate 403, and the second dummy gate 411. The process may further include: performing planarization (for example, CMP) on the interlayer dielectric layer 402, so as to expose the upper surfaces of the first dummy gate 403 and the second dummy gate 411.

Figure 4B:
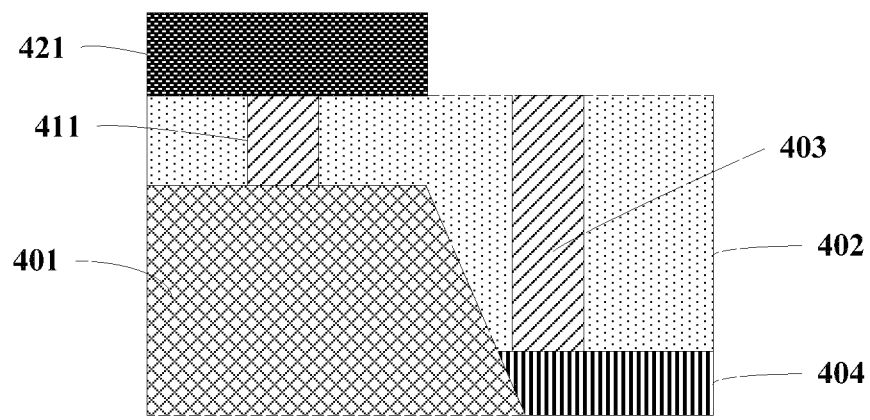

Subsequently, as shown in FIG. 4B, a first patterned mask layer (for example, a photo-resist) 421 is formed on the interlayer dielectric layer 402, where the first patterned mask layer 421 covers the second dummy gate 411 and exposes the first dummy gate 403.

Figure 4C:
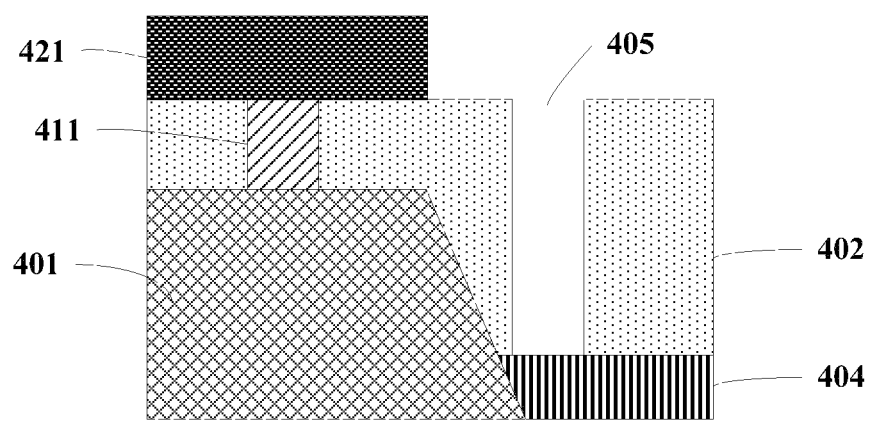

Subsequently, as shown in FIG. 4C, the first dummy gate 403 is removed by using an etching process, so as to form an opening 405.

Figure 4D:
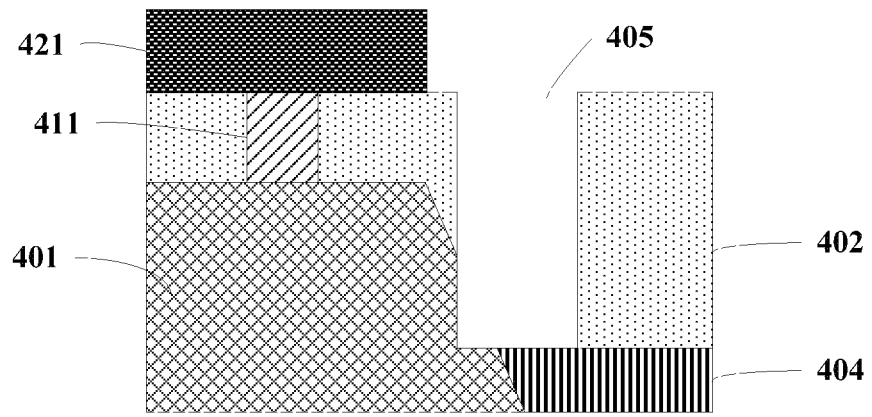

Subsequently, as shown in FIG. 4D, the opening 405 is enlarged by using an etching process (for example, isotropic dry etching process) to reach the semiconductor fin 401, so as to expose a part of the semiconductor fin 401. This may increase feature size of the opening 405 and lead to a more relaxed process control precision for implementation of the subsequent process of filling the opening 405 and forming a contact after the opening is filled (as will be described below).

Subsequently, the first patterned mask layer 421 is removed.

Figure 4E:
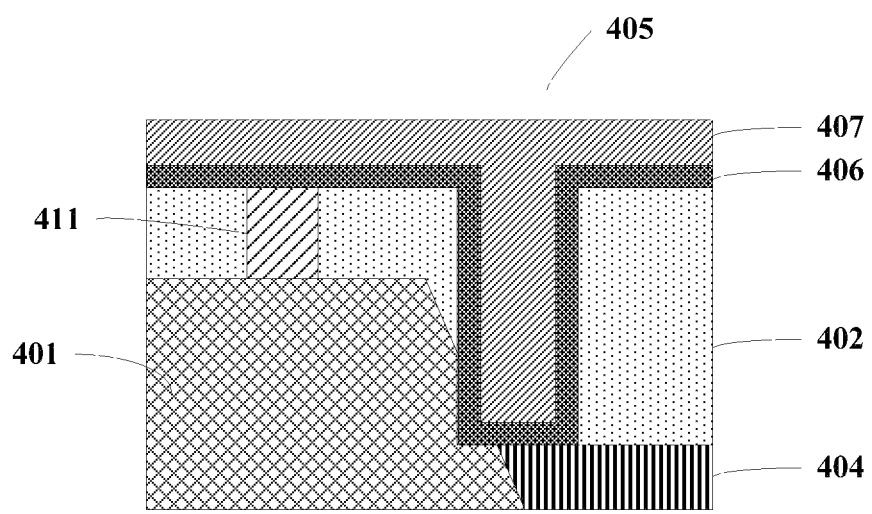

Subsequently, as shown in FIG. 4E, a data storage layer (for example, TMO) 406 is deposited, and the data storage layer may be enabled to be formed at a bottom portion and a side surface of the opening 405. Following this, a conductive material layer (for example, tungsten) 407 is deposited on the data storage layer 406, and the conductive material layer 407 may be enabled to fill the opening 405 over the data storage layer.

Figure 4F:
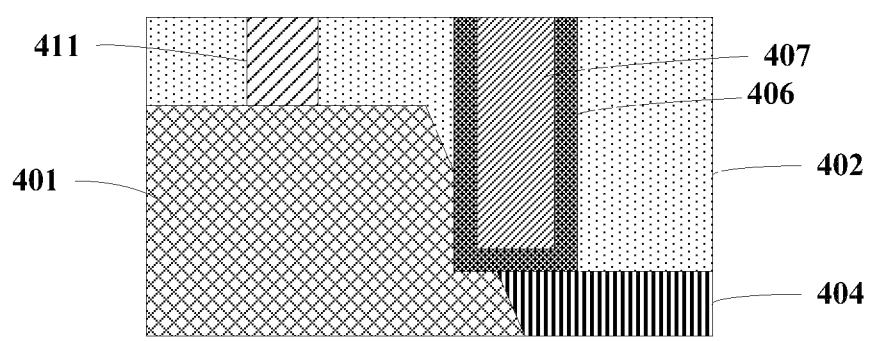

Subsequently, as shown in FIG. 4F, the structure shown in FIG. 4E is planarized, so as to remove the data storage layer and the conductive material layer outside the opening.

Subsequently, the manufacturing method may further include: forming, in the interlayer dielectric layer 402, a gate structure located on the semiconductor fin 401.

In one implementation, the step of forming the gate structure may include: removing the second dummy gate 411, so as to form an open trench exposing a part of the semiconductor fin 401.

Figure 4G:
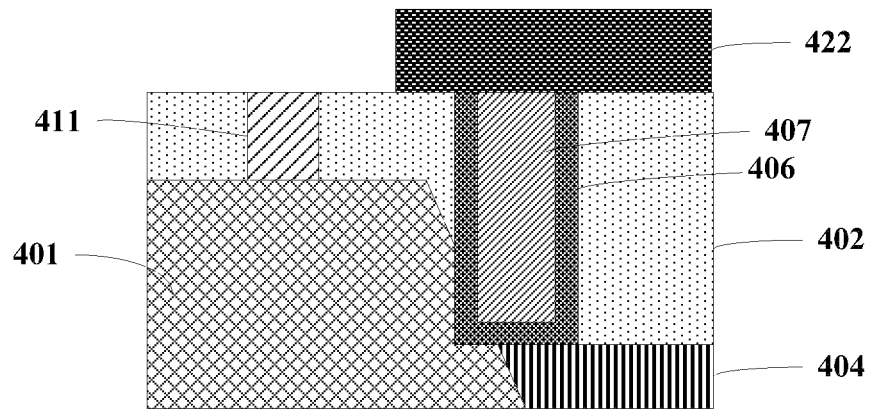
Figure 4H:
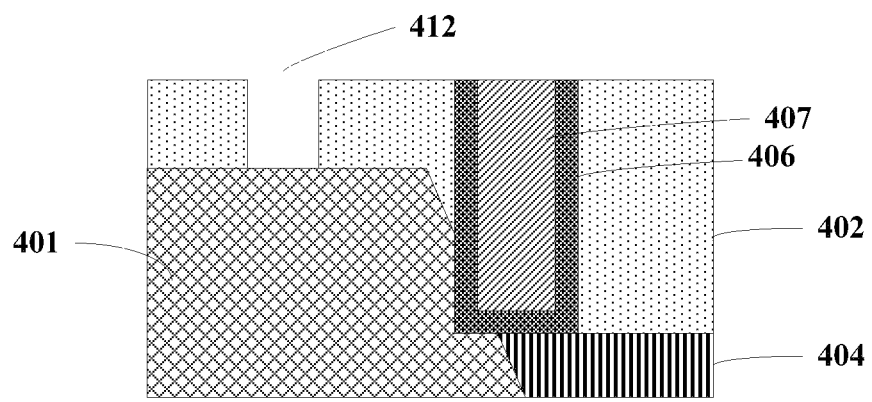

For example, the step of removing the second dummy gate 411 may include: as shown in FIG. 4G, forming a second patterned mask layer (for example, a photo-resist) 422 on the interlayer dielectric layer 402, where the second patterned mask layer 422 covers the data storage layer 406 and the conductive material layer 407 and exposes the second dummy gate 411. The step of removing the second dummy gate 411 may further include, as shown in FIG. 4H, removing the second dummy gate 411 by using an etching process, so as to form the open trench 412 exposing part of the semiconductor fin 401. The step of removing the second dummy gate 411 may further include: as shown in FIG. 4H, removing the second patterned mask layer 422.

Figure 4I:
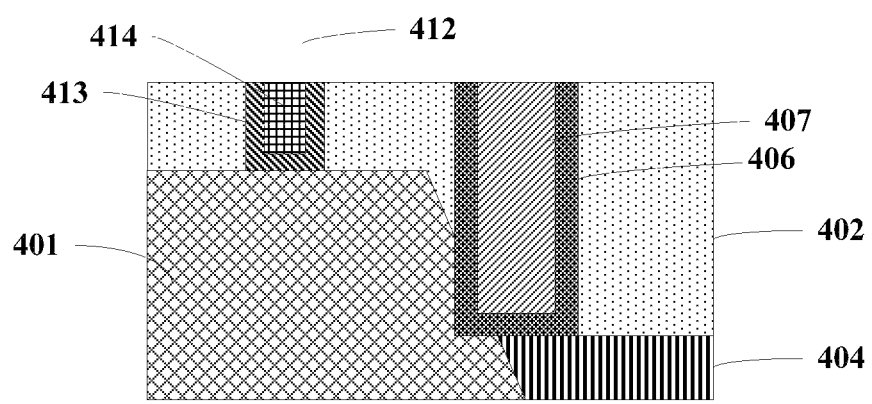

Subsequently, the step of forming the gate structure may further include: as shown in FIG. 4I, forming a gate structure in the open trench 412. The gate structure may include: a gate insulator layer 413 wrapping a part of the semiconductor fin 401 and a gate electrode 414 on the gate insulator layer 413. For example, material of the gate insulator layer 413 may include a high k (dielectric constant) dielectric layer. Material of the gate electrode 414 may include metals such as tungsten. In some forms, the gate electrode may further include: a work function material layer (not shown in the figures) between the gate insulator layer 413 and the gate electrode 414. For example, material of the work function material layer may include: Al—Si (aluminum silicon) and/or TiN (titanium nitride).

Figure 4J:
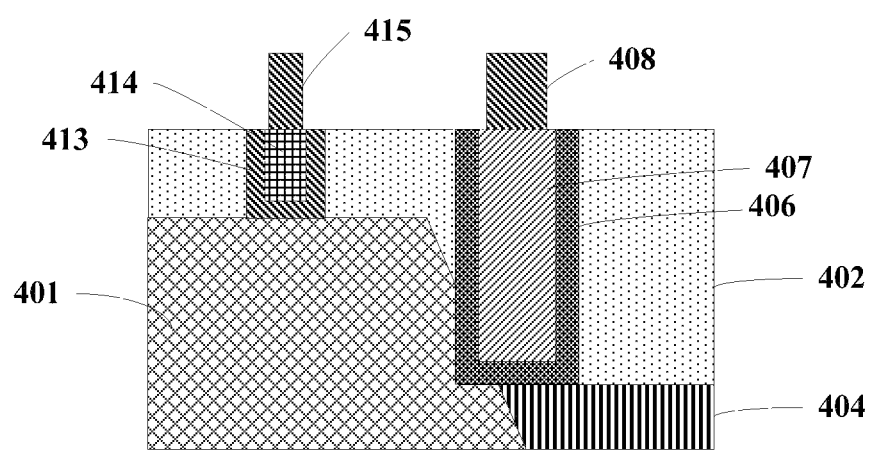

Subsequently, as shown in FIG. 4J, a conductive contact 408 may be formed on the conductive material layer 407, and a gate contact 415 may be formed on the gate electrode 414. For example, materials of the conductive contact 408 and the gate contact 415 may both be tungsten.

A method for manufacturing a semiconductor device according to another form of the present disclosure is provided above. This method may be used to manufacture a resistive memory based on the FinFET technology. The manufacturing method in the forms described above may help enlarge feature size during some manufacturing steps, and thus facilitates implementation of the manufacturing process and compatibility with the CMOS technology. In addition, the manufacturing method above does not rely on the self-aligning contact process and thus avoids difficulties associated with such a process.

According to the manufacturing method of disclosed above, an exemplary semiconductor device is formed. For example, as shown in FIG. 4J, the semiconductor device may include a semiconductor fin 401 and an interlayer dielectric layer 402 covering the semiconductor fin 401. The interlayer dielectric layer 402 includes an opening (for example, the opening 405 of FIG. 4D exposing a part of the semiconductor fin 401. The semiconductor device may further include a data storage layer (for example, material of the data storage layer may include TMO) 406 in the opening of the interlayer dielectric layer. The data storage layer 406 may be in contact with a part of semiconductor fin 401. The semiconductor device may further include a conductive material layer 407 surrounded by the data storage layer 406. The semiconductor device according to the forms above may be used as a resistive memory. The semiconductor device possesses several advantages such as relaxed processing control precision, manufacturing simplicity, and compatibility with the CMOS process.

In a form, as shown in FIG. 4J, the semiconductor device may further include: a trench isolation portion 404 which abuts against a side surface of the semiconductor fin 401. The data storage layer 406 is located above the trench isolation portion 404.

In a form, as shown in FIG. 4J, a side surface of the semiconductor fin 401 may be an inclined surface, and the data storage layer 406 is in contact with the inclined surface.

In a form, as shown in FIG. 4J, the semiconductor device may further include: a conductive contact 408 on the conductive material layer 407.

In a form, as shown in FIG. 4J, the semiconductor device may further include: a gate structure in the interlayer dielectric layer 402 and located on the semiconductor fin 401. The gate structure may include: a gate insulator layer 413 wrapping a part of the semiconductor fin 401 and a gate electrode 414 on the gate insulator layer 413. In some forms, the gate electrode may further include: a work function material layer (not shown in the figures) between the gate insulator layer 413 and the gate electrode 414.

In a form, as shown in FIG. 4J, the semiconductor device may further include: a gate contact 415 on the gate electrode 414.

To avoid obscuring the idea of the present disclosure, some details generally known in the art are not described in the forms and implementations above. According to the foregoing description, a person of ordinary skill in the art understands how to implement the technical solutions disclosed herein.

Some specific forms of the present disclosure are described in detail through examples. However, a person of ordinary skill in the art should understand that the foregoing examples are merely illustrative, and are not intended to limit the scope of the present disclosure. A person of ordinary skill in the art should understand that the foregoing forms may be modified without departing from the scope and spirit of the present disclosure. The scope of the present disclosure encompasses at least that defined by the appended claims.

What is claimed is:

1. A semiconductor device, comprising:
   a semiconductor fin;
   an interlayer dielectric layer covering the semiconductor fin, wherein the interlayer dielectric layer has an opening, a bottom horizontal surface of the opening exposing a top horizontal surface of a first part of the semiconductor fin, the top horizontal surface of the first part being lower than a highest top horizontal surface of the semiconductor fin;
   a data storage layer in the opening of the interlayer dielectric layer, where the data storage layer is in direct contact with the first part of the semiconductor fin; and
   a conductive material layer filling the opening and surrounded by the data storage layer.

2. The semiconductor device according to claim 1, further comprising a trench isolation portion abutting a side surface of the semiconductor fin, wherein the data storage layer is located above the trench isolation portion.

3. The semiconductor device according to claim 1, wherein a side surface of the semiconductor fin is an inclined surface, the first part of the semiconductor fin exposed by the opening is within the inclined surface.

4. The semiconductor device according to claim 1, wherein the data storage layer comprises a transition metal oxide.

5. The semiconductor device according to claim 1, further comprising a conductive contact on the conductive material layer.

6. The semiconductor device according to claim 1, further comprising a gate structure in the interlayer dielectric layer and located on the semiconductor fin.

* * * * *